United States Patent
Todorov et al.

(10) Patent No.: US 11,586,899 B2
(45) Date of Patent: *Feb. 21, 2023

(54) NEUROMORPHIC DEVICE WITH OXYGEN SCAVENGING GATE

(71) Applicant: INTERNATIONAL BUSINESS MACHINES CORPORATION, Armonk, NY (US)

(72) Inventors: Teodor Krassimirov Todorov, Yorktown Heights, NY (US); Jianshi Tang, Elmsford, NY (US); Douglas M. Bishop, New York, NY (US); John Rozen, Hastings on Hudson, NY (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 718 days.

This patent is subject to a terminal disclaimer.

(21) Appl. No.: 16/435,850

(22) Filed: Jun. 10, 2019

(65) Prior Publication Data
US 2020/0387779 A1 Dec. 10, 2020

(51) Int. Cl.
*H01L 27/28* (2006.01)
*G06N 3/063* (2023.01)
(Continued)

(52) U.S. Cl.
CPC ............ *G06N 3/0635* (2013.01); *G06N 3/08* (2013.01); *H01L 27/285* (2013.01);
(Continued)

(58) Field of Classification Search
CPC ............................................. H01L 2924/13074
See application file for complete search history.

(56) References Cited

U.S. PATENT DOCUMENTS 9,640,639 B2    5/2017 Yamazaki
10,079,341 B1 *  9/2018 Bedell ................. H01L 27/2463
(Continued)

FOREIGN PATENT DOCUMENTS

| CN | 107068860 A | | 8/2017 | |
| JP | 2009076670 A | * | 4/2009 | ......... G11C 13/0002 |
| WO | 2017115340 A1 | | 7/2017 | |

OTHER PUBLICATIONS

Gkoupidenis, P., Schaefer, N., Garlan, B. and Malliaras, G.G. (2015), Neuromorphic Functions in PEDOT:PSS Organic Electrochemical Transistors. Adv. Mater., 27: 7176-7180. (Year: 2015).*
(Continued)

*Primary Examiner* — Jarrett J Stark
(74) *Attorney, Agent, or Firm* — Cantor Colburn LLP; Daniel Yeates

(57) ABSTRACT

A method of fabricating a neuromorphic device includes forming a variable-resistance layer between a first terminal and a second terminal, the variable-resistance layer varies in resistance based on an oxygen concentration in the variable-resistance layer. The method further includes forming an electrolyte layer over the variable-resistance layer that is stable at room temperature and that conducts oxygen ions in accordance with an applied voltage. The method further includes forming a gate layer over the electrolyte layer to apply a voltage on the electrolyte layer and the variable-resistance layer, the gate layer formed using an oxygen scavenging material.

11 Claims, 7 Drawing Sheets

(51) Int. Cl.
*G06N 3/08* (2023.01)
*H01L 45/00* (2006.01)

(52) U.S. Cl.
CPC ...... *H01L 45/1206* (2013.01); *H01L 45/1608* (2013.01); *H01L 2924/13074* (2013.01)

(56) References Cited

U.S. PATENT DOCUMENTS

| | | | |
|---|---|---|---|
| 10,930,844 B2* | 2/2021 | Todorov | H01L 45/08 |
| 2007/0176264 A1* | 8/2007 | Lee | H01L 45/04 |
| | | | 257/614 |
| 2009/0042346 A1* | 2/2009 | Kugler | H01L 51/0529 |
| | | | 438/197 |
| 2015/0130069 A1* | 5/2015 | Mahajan | H05K 1/167 |
| | | | 257/773 |
| 2015/0307730 A1* | 10/2015 | Hersam | C09D 11/52 |
| | | | 430/308 |
| 2017/0148982 A1* | 5/2017 | Karpov | H01L 29/45 |
| 2018/0197917 A1 | 7/2018 | Ando | |
| 2020/0119267 A1* | 4/2020 | Todorov | G06N 3/04 |
| 2020/0318255 A1* | 10/2020 | Lhuillier | C30B 7/14 |
| 2020/0387779 A1* | 12/2020 | Todorov | H01L 27/285 |
| 2021/0012974 A1* | 1/2021 | Zhou | G06N 3/08 |
| 2021/0020780 A1* | 1/2021 | Rozen | H01L 29/24 |
| 2021/0313529 A1* | 10/2021 | Khodagholy | G01N 27/414 |

OTHER PUBLICATIONS

Organic electronics for neuromorphic computing. Nat Electron 1, 386-397 (2018). (Year: 2018).*

Device physics of organic electrochemical transistors, Organic Electronics, vol. 63, 2018, pp. 398-414, ISSN 1566-1199, (Year: 2018).*

* cited by examiner f(x) = f (INPUT 1 * CONNECTION STRENGTH 1 + INPUT 2 * CONNECTION STRENGTH 2)

NEUROMORPHIC DEVICE WITH OXYGEN SCAVENGING GATE

BACKGROUND

The present invention relates in general to neuromorphic devices having settable resistances and, more particularly, to neuromorphic devices that use a room-temperature, solid electrolyte to mediate the transfer of oxygen ions for resistivity control.

Technical problems such as character recognition and image recognition by a computer are known to be well handled by machine-learning techniques. "Machine learning" is used to broadly describe a primary function of electronic systems that learn from data. In machine learning and cognitive science, artificial neural networks (ANNs) are a family of statistical learning models inspired by the biological neural networks of animals, and in particular the brain. ANNs can be used to estimate or approximate systems and functions that depend on a large number of inputs and are generally unknown. ANNs can include deep neural networks (DNNs), convolutional neural networks (CNNs), and other types of neural networks. Crossbar arrays are high density, low cost circuit architectures used to form a variety of electronic circuits and devices, including ANN architectures, neuromorphic microchips and ultra-high density non-volatile memory. A basic cross-bar array configuration includes a set of conductive row wires and a set of conductive column wires formed to intersect the set of conductive row wires. The intersections between the two sets of wires are separated by so-called cross-point devices.

SUMMARY

According to one or more embodiments of the present invention, a method of fabricating a neuromorphic device includes forming a variable-resistance layer between a first terminal and a second terminal, the variable-resistance layer varies in resistance based on an oxygen concentration in the variable-resistance layer. The method further includes forming an electrolyte layer over the variable-resistance layer that is stable at room temperature and that conducts oxygen ions in accordance with an applied voltage. The method further includes forming a gate layer over the electrolyte layer to apply a voltage on the electrolyte layer and the variable-resistance layer, the gate layer formed using an oxygen scavenging material.

According to one or more embodiments of the present invention, a system includes a controller, and a crossbar array coupled with the controller. The crossbar array operates as a neural network. The crossbar array includes a neuromorphic device at each of a plurality of cross-points. The neuromorphic device includes a transistor that includes a variable-resistance layer formed between a first terminal and a second terminal, and that varies in resistance based on an oxygen concentration in the variable-resistance layer. The transistor further includes an electrolyte layer over the variable-resistance layer that is stable at room temperature and that conducts oxygen ions in accordance with an applied voltage. The transistor further includes a gate layer over the electrolyte layer configured to apply a voltage on the electrolyte layer and the variable-resistance layer, the gate layer forming an oxygen scavenging gate electrode.

According to one or more embodiments of the present invention, a neuromorphic device includes a variable-resistance layer, formed between a first terminal and a second terminal, that varies in resistance based on an oxygen concentration in the variable-resistance layer. The neuromorphic device further includes an electrolyte layer over the variable-resistance layer that is stable at room temperature and that conducts oxygen ions in accordance with an applied voltage. The neuromorphic device further includes a gate layer over the electrolyte layer configured to apply a voltage on the electrolyte layer and the variable-resistance layer, the gate layer forming an oxygen scavenging gate electrode.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

Figure 1:
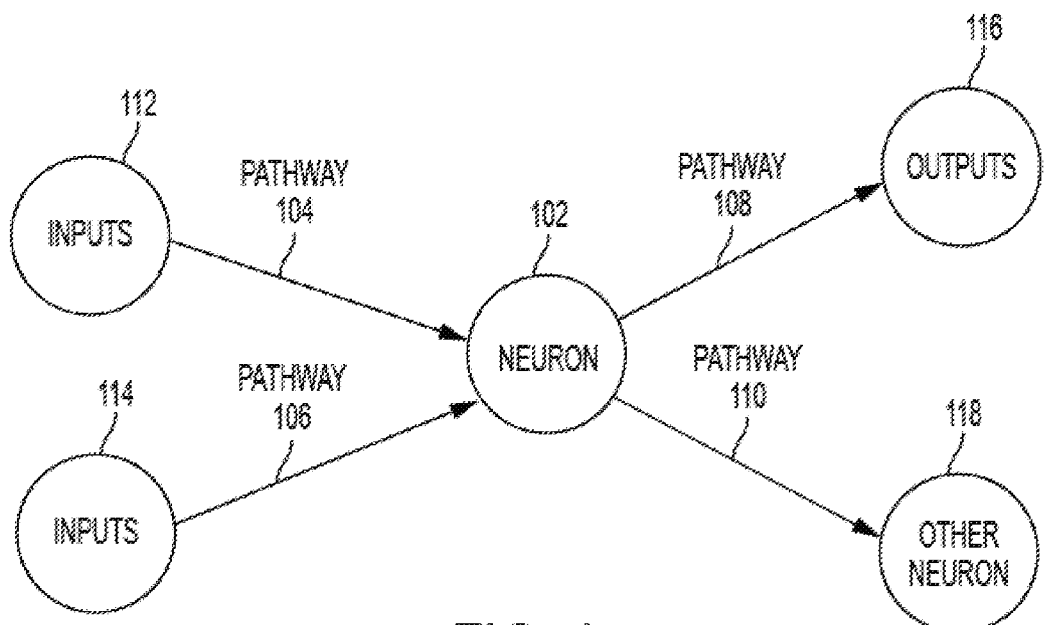
FIG. 1 depicts a simplified diagram of input and output connections of a biological neuron.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Additionally, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It is understood in advance that although one or more embodiments are described in the context of biological neural networks with a specific emphasis on modeling brain structures and functions, implementation of the teachings recited herein are not limited to modeling a particular environment. Rather, embodiments of the present invention are capable of modeling any type of environment, including for example, weather patterns, arbitrary data collected from the internet, and the like, as long as the various inputs to the environment can be turned into a vector.

Turning now to an overview of technologies that are more specifically relevant to aspect of the invention, ANNs can be used to estimate or approximate systems and functions that depend on a large number of inputs and are generally unknown. Neural networks use a class of algorithms based on a concept of inter-connected "neurons." In a typical neural network, neurons have a given activation function that operates on the inputs. By determining proper connection weights (a process also referred to as "training"), a neural network achieves efficient recognition of a desired patterns, such as images and characters. Oftentimes, these neurons are grouped into "layers" in order to make connections between groups more obvious and to each computation of values. Training the neural network is a computationally intense process.

ANNs are often embodied as so-called "neuromorphic" systems of interconnected processor elements that act as simulated "neurons" and exchange "messages" between each other in the form of electronic signals. Similar to the so-called "plasticity" of synaptic neurotransmitter connections that carry messages between biological neurons, the connections in ANNs that carry electronic messages between simulated neurons are provided with numeric weights that correspond to the strength or weakness of a given connection. The weights can be adjusted and tuned based on experience, making ANNs adaptive to inputs and capable of learning. For example, an ANN for handwriting recognition is defined by a set of input neurons which can be activated by the pixels of an input image. After being weighted and transformed by a function determined by the network's designer, the activations of these input neurons are then passed to other downstream neurons, which are often referred to as "hidden" neurons. This process is repeated until an output neuron is activated. The activated output neuron determines which character was read.

Crossbar arrays, also known as cross-point arrays or crosswire arrays, are high density, low cost circuit architectures used to form a variety of electronic circuits and devices, including ANN architectures, neuromorphic microchips and ultra-high density nonvolatile memory. A basic cross-bar array configuration includes a set of conductive row wires and a set of conductive column wires formed to intersect the set of conductive row wires. The intersections between the two sets of wires are separated by so-called cross-point devices, which can be formed from thin film material.

Cross-point devices, in effect, function as synapses, i.e. the ANN's weighted connections between neurons. Nanoscale devices, for example memristors having "ideal" conductance state switching characteristics, are often used as the cross-point devices in order to emulate synaptic plasticity with high energy efficiency. The conductance state (e.g., resistance) of the ideal memristor material can be altered by controlling the voltages applied between individual wires of the row and column wires. Digital data can be stored by alteration of the memristor material's conductance state at the intersection to achieve a high conductance state or a low conductance state. The memristor material can also be programmed to maintain two or more distinct conductance states by selectively setting the conductance state of the material. The conductance state of the memristor material can be read by applying a voltage across the material and measuring the current that passes through the target cross-point device. So far, however, there have been some practical drawbacks in memristor and other resistive-random-access-memory (RRAM) based cross-point devices that are detrimental to ANN applications; significant device-to-device variability and the asymmetry between "set (i.e. to increment resistance)" and "reset (i.e. to decrement resistance)" operations are two such main limitations.

In order to limit power consumption, the cross-point devices of ANN chip architectures are often designed to utilize offline learning techniques, wherein the approximation of the target function does not change once the initial training phase has been resolved. Offline learning allows the cross-point devices of cross-bar-type ANN architectures to be simplified such that they draw very little power.

Notwithstanding the potential for lower power consumption, executing offline training can be difficult and resource intensive because it is typically necessary during training to modify a significant number of adjustable parameters (e.g., weights) in the ANN model to match the input-output pairs for the training data. Accordingly, simplifying the cross-point devices of ANN architectures to prioritize power-saving, offline learning techniques typically means that training speed and training efficiency are not optimized.

Providing simple cross-point devices that keep power consumption within an acceptable range, as well as accelerate the speed and efficiency of training ANN architectures, would improve overall ANN performance and allow a broader range of ANN applications. Device characteristics usually considered beneficial or irrelevant for memory applications such as high on/off ratio, digital bit-wise storage, and asymmetrical set and reset operations, are becoming limitations for acceleration of ANN training. These non-ideal device characteristics can potentially be compensated with a proper design of peripheral circuits and a whole system, but only partially and with a cost of significantly increased operational time.

Accordingly, specialized hardware for implementing ANNs are being used that are faster than regular computers. One of the ways is to have an object that has a resistance and to reversibly control this resistance and program it by some means. Unlike devices that can have resistance set only once for inferencing purposes, there is a need to be able to change back and forth resistance in order to enable training.

Programming the resistances in ANNs is a very difficult task. One or more embodiments of the present invention facilitate programming of resistances by changing the resistivity of metal oxide elements via intercalation. One of the features of the present invention is the ability to program individual resistive elements efficiently and faster than existing solutions. For example, lithium intercalation materials (for example, LiCoO2) exhibiting resistivity change as a function of Li content are used for neuromorphic and analog computing applications such as synaptic transistors that can be used in the neuromorphic devices. Lithium compounds are both water and air-sensitive and not readily compatible with standard microfabrication procedures. However, oxygen concentration can tune resistivity in several oxides. Accordingly, a technical challenge exists to obtain a solid oxygen conductive electrolyte because most oxides present variable electric conductivity with fluctuations of oxygen content. Further, typical oxygen ionic conductors such as the ones employed in fuel cells are only functional at elevated temperatures (and not room temperature). Therefore, $LaF_3$ has been used as a room-temperature electrolyte for oxygen sensors to address such technical challenge. However, oxygen intercalation, even with $LaF_3$ has had relatively low on/off ratio (50%) and high read/write resistance due to difficulty in controlling excessive oxygen content.

Accordingly, there is a need in the art for device structures with component appropriate oxygen scavenging species for robust fabrication and reliable switching, and which can be operated at room temperature (not elevated temperatures). One or more embodiments of the present invention address such technical challenge in the art and provides an oxygen-ion actuated analog switching device employing $LaF_3$ as room-temperature solid electrolyte. As will be described in detail herein, one or more embodiments of the present invention address the technical challenge by facilitating a neuromorphic device that includes a substrate with source and drain electrodes, an oxide channel layer (such as but not limited to $WO_3$ or $TiO_2$), an $LaF_3$ solid electrolyte and an oxygen scavenging gate electrode such as but not limited to aluminum. According to one or more embodiments of the present invention the neuromorphic device can also include an oxygen reservoir such as but not limited to $CeO_2$.

The technical solutions described herein further address technical challenges for the cross-bar array devices, which use the neuromorphic devices for implementing ANNs or other practical applications. In one or more embodiments of the invention, weight elements are stored in the neuromorphic devices that uses an oxygen scavenging electrode. Such a neuromorphic device is associated with each cross-point synaptic device. Here, "weight" refers to a computational value being used during computations of an ANN as described further.

Although embodiments of the present invention are directed to electronic systems, for ease of reference and explanation various aspects of the electronic systems are described using neurological terminology such as neurons, plasticity and synapses, for example. It will be understood that for any discussion or illustration herein of an electronic system, the use of neurological terminology or neurological shorthand notations are for ease of reference and are meant to cover the neuromorphic, ANN equivalent(s) of the described neurological function or neurological component.

Instead of utilizing the traditional digital model of manipulating zeros and ones, ANNs create connections between processing elements that are substantially the functional equivalent of the core system functionality that is being estimated or approximated. For example, a computer chip that can include one or more cross-bar arrays (described further), along with peripheral circuitry, is the central component of an electronic neuromorphic machine that attempts to provide similar form, function and architecture to the mammalian brain. Although the computer chip uses the same basic transistor components as conventional computer chips, its transistors are configured to mimic the behavior of neurons and their synapse connections. One or more embodiments of the present invention describe include such transistors that can be used in a neuromorphic system as cross-point devices. The computer chip processes information using a network of just over one million simulated "neurons," which communicate with one another using electrical spikes similar to the synaptic communications between biological neurons. The computer chip architecture includes a configuration of processors (i.e., simulated "neurons") that read a memory (i.e., a simulated "synapse") and perform simple operations. The communications between these processors, which are typically located in different cores, are performed by on-chip network routers.

Figure 2:
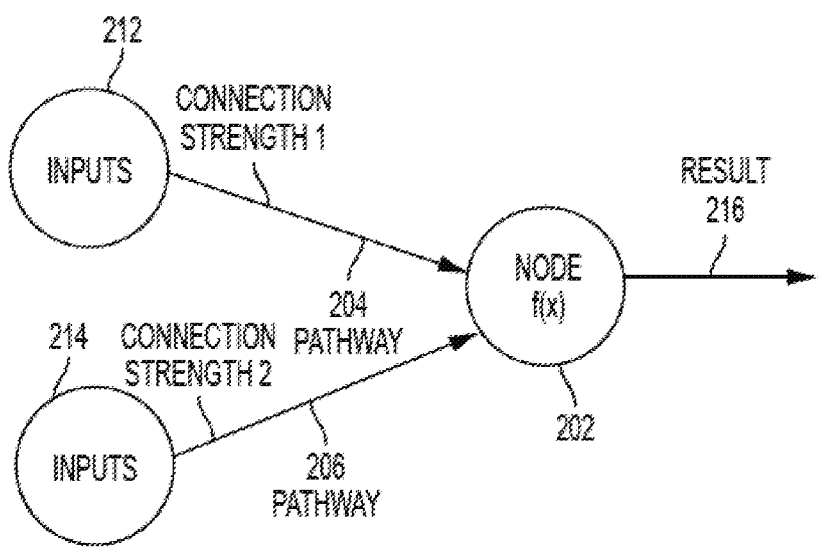
FIG. 2 depicts a known simplified model of the biological neuron shown in FIG. 1.
Figure 3:
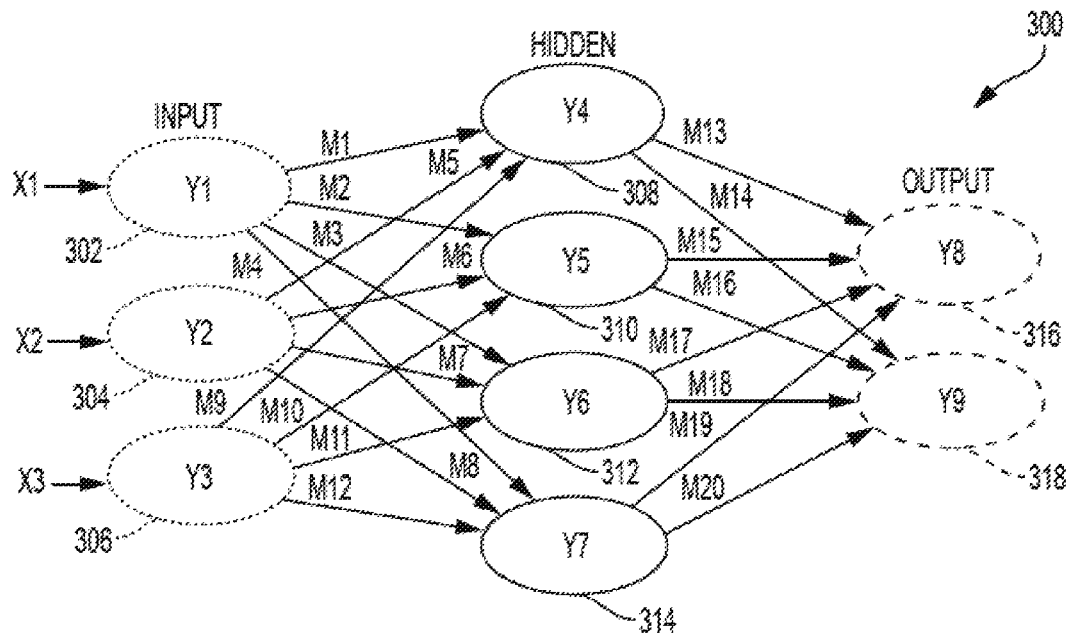
FIG. 3 depicts a known simplified model of an ANN incorporating the biological neuron model shown in FIG. 2.

A general description of how a typical ANN operates will now be provided with reference to FIGS. 1, 2 and 3. As previously noted herein, a typical ANN models the human brain, which includes about one hundred billion interconnected cells called neurons. FIG. 1 depicts a simplified diagram of a biological neuron 102 having pathways 104, 106, 108, 110 that connect it to upstream inputs 112, 114, downstream outputs 116 and downstream "other" neurons 118, configured and arranged as shown. Each biological neuron 102 sends and receives electrical impulses through pathways 104, 106, 108, 110. The nature of these electrical impulses and how they are processed in biological neuron 102 are primarily responsible for overall brain functionality. The pathway connections between biological neurons can be strong or weak. When a given neuron receives input impulses, the neuron processes the input according to the neuron's function and sends the result of the function to downstream outputs and/or downstream "other" neurons.

Biological neuron 102 is modeled in FIG. 2 as a node 202 having a mathematical function, f(x) depicted by the equation shown in FIG. 2. Node 202 takes electrical signals from inputs 212, 214, multiplies each input 212, 214 by the strength of its respective connection pathway 204, 206, takes a sum of the inputs, passes the sum through a function, f(x), and generates a result 216, which can be a final output or an input to another node, or both. In the present description, an asterisk (*) is used to represent a multiplication. Weak input signals are multiplied by a very small connection strength number, so the impact of a weak input signal on the function is very low. Similarly, strong input signals are multiplied by a higher connection strength number, so the impact of a strong input signal on the function is larger. The function f(x) is a design choice, and a variety of functions can be used. An example design choice for f(x) is the hyperbolic tangent function, which takes the function of the previous sum and outputs a number between minus one and plus one.

FIG. 3 depicts a simplified ANN model 300 organized as a weighted directional graph, wherein the artificial neurons are nodes (e.g., 302, 308, 316), and wherein weighted directed edges (e.g., m1 to m20) connect the nodes. It should be noted that the ANN model 300 depicted is a fully connected DNN, however, the technical solutions described herein are also applicable in case of other types of ANNs, such as CNN, partially connected DNN, and the like, and not just limited to a fully connected DNN. ANN model 300 is organized such that nodes 302, 304, 306 are input layer nodes, nodes 308, 310, 312, 314 are hidden layer nodes and nodes 316, 318 are output layer nodes. Each node is connected to every node in the adjacent layer by connection pathways, which are depicted in FIG. 3 as directional arrows having connection strengths m1 to m20. Although only one input layer, one hidden layer and one output layer are shown, in practice, multiple input layers, hidden layers and output layers can be provided.

Similar to the functionality of a human brain, each input layer node 302, 304, 306 of ANN 300 receives inputs x1, x2, x3 directly from a source (not shown) with no connection strength adjustments and no node summations. Accordingly, y1=f(x1), y2=f(x2) and y3=f(x3), as shown by the equations listed at the bottom of FIG. 3. Each hidden layer node 308, 310, 312, 314 receives its inputs from all input layer nodes 302, 304, 306 according to the connection strengths associated with the relevant connection pathways. Thus, in hidden layer node 308, y4=f(m1*y1+m5*y2+m9*y3), wherein * represents a multiplication. A similar connection strength multiplication and node summation is performed for hidden layer nodes 310, 312, 314 and output layer nodes 316, 318, as shown by the equations defining functions y5 to y9 depicted at the bottom of FIG. 3.

ANN model 300 processes data records one at a time, and it "learns" by comparing an initially arbitrary classification of the record with the known actual classification of the record. Using a training methodology knows as "backpropagation" (i.e., "backward propagation of errors"), the errors from the initial classification of the first record are fed back into the network and used to modify the network's weighted connections the second time around, and this feedback process continues for many iterations. In the training phase of an ANN, the correct classification for each record is known, and the output nodes can therefore be assigned "correct" values. For example, a node value of "1" (or 0.9) for the node corresponding to the correct class, and a node value of "0" (or 0.1) for the others. It is thus possible to compare the network's calculated values for the output nodes to these "correct" values, and to calculate an error term for each node (i.e., the "delta" rule). These error terms are then used to adjust the weights in the hidden layers so that in the next iteration the output values will be closer to the "correct" values.

There are many types of neural networks, but the two broadest categories are feed-forward and feedback/recurrent networks. ANN model 300 is a non-recurrent feed-forward network having inputs, outputs and hidden layers. The signals can only travel in one direction. Input data is passed onto a layer of processing elements that perform calculations. Each processing element makes its computation based upon a weighted sum of its inputs. The new calculated values then become the new input values that feed the next layer. This process continues until it has gone through all the layers and determined the output. A threshold transfer function is sometimes used to quantify the output of a neuron in the output layer.

A feedback/recurrent network includes feedback paths, which mean that the signals can travel in both directions using loops. All possible connections between nodes are allowed. Because loops are present in this type of network, under certain operations, it can become a non-linear dynamical system that changes continuously until it reaches a state of equilibrium. Feedback networks are often used in associative memories and optimization problems, wherein the network looks for the best arrangement of interconnected factors.

The speed and efficiency of machine learning in feed-forward and recurrent ANN architectures depend on how effectively the cross-point devices of the ANN cross-bar array perform the core operations of typical machine learning algorithms. Although a precise definition of machine learning is difficult to formulate, a learning process in the ANN context can be viewed as the problem of updating the cross-point device connection weights so that a network can efficiently perform a specific task. The cross-point devices typically learn the necessary connection weights from available training patterns. Performance is improved over time by iteratively updating the weights in the network. Instead of following a set of rules specified by human experts, ANNs "learn" underlying rules (like input-output relationships) from the given collection of representative examples. Accordingly, a learning algorithm can be generally defined as the procedure by which learning rules are used to update and/or adjust the relevant weights.

The three main learning algorithm paradigms are supervised, unsupervised and hybrid. In supervised learning, or learning with a "teacher," the network is provided with a correct answer (output) for every input pattern. Weights are determined to allow the network to produce answers as close as possible to the known correct answers. Reinforcement learning is a variant of supervised learning in which the network is provided with only a critique on the correctness of network outputs, not the correct answers themselves. In contrast, unsupervised learning, or learning without a teacher, does not require a correct answer associated with each input pattern in the training data set. It explores the underlying structure in the data, or correlations between patterns in the data, and organizes patterns into categories from these correlations. Hybrid learning combines supervised and unsupervised learning. Parts of the weights are usually determined through supervised learning, while the others are obtained through unsupervised learning.

As previously noted herein, in order to limit power consumption, the cross-point devices of ANN chip architectures are often designed to utilize offline learning techniques, wherein the approximation of the target function does not change once the initial training phase has been resolved. Offline learning allows the cross-point devices of cross-bar-type ANN architectures to be simplified such that they draw very little power.

Figure 4:
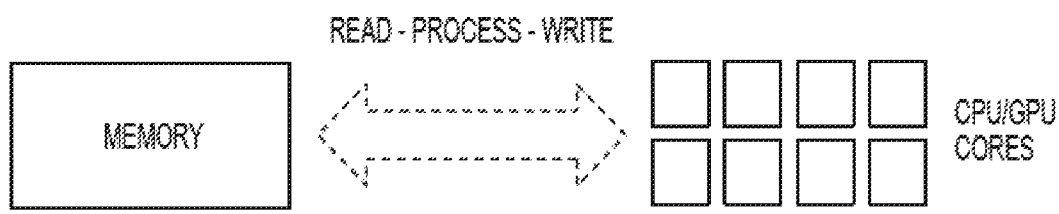
FIG. 4 depicts a simplified illustration of a typical read-process-write weight update operation.

Notwithstanding the potential for lower power consumption, executing offline training can be difficult and resource intensive because it is typically necessary during training to modify a significant number of adjustable parameters (e.g., weights) in the ANN model to match the input-output pairs for the training data. FIG. 4 depicts a simplified illustration of a typical read-process-write weight update operation, wherein CPU/GPU cores (i.e., simulated "neurons") read a memory (i.e., a simulated "synapse") and perform weight update processing operations, then write the updated weights back to memory. Accordingly, simplifying the cross-point devices of ANN architectures to prioritize power-saving, offline learning techniques typically means that training speed and training efficiency are not optimized.

Figure 5:
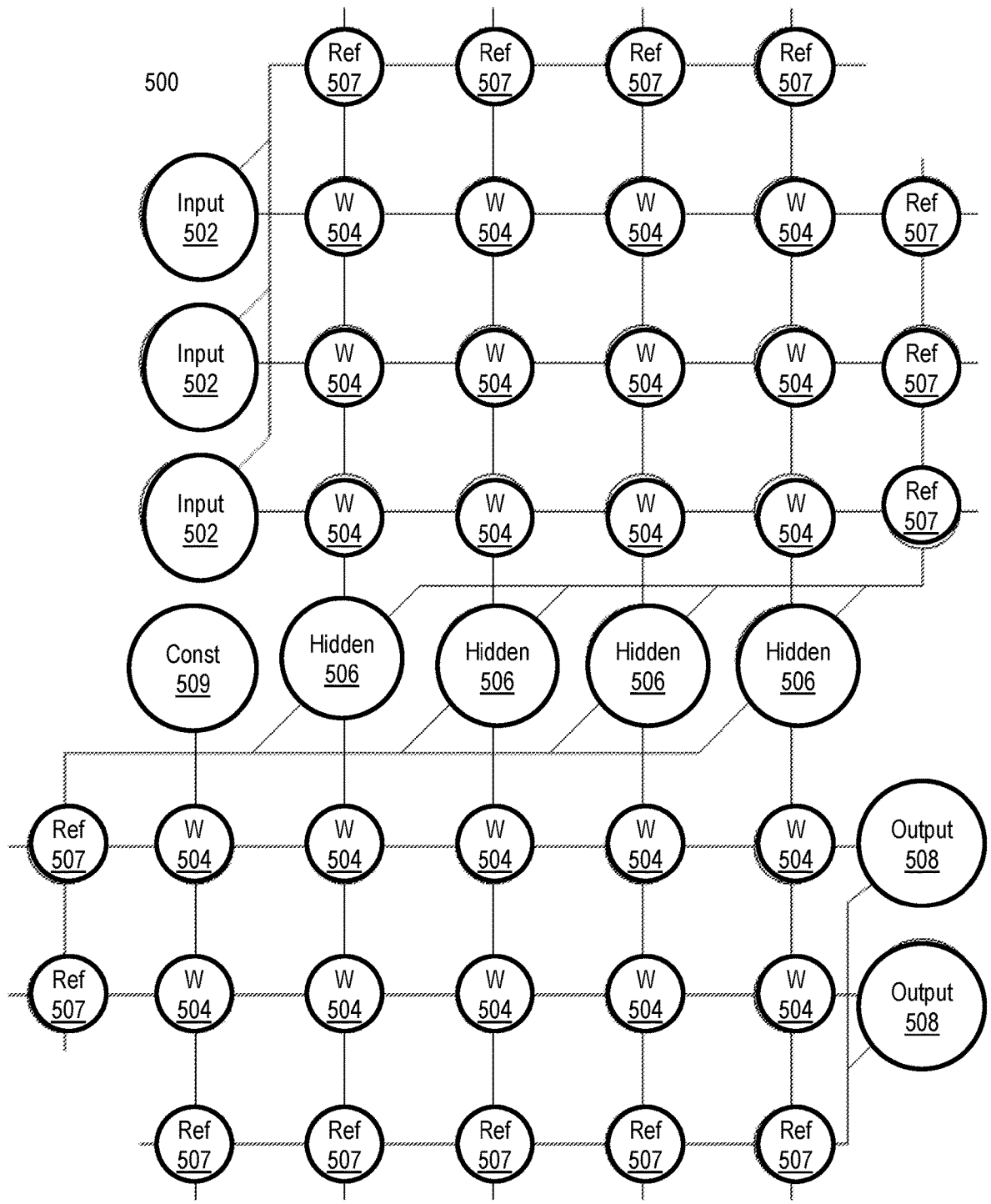
FIG. 5 illustrates an artificial neural network (ANN) architecture.

FIG. 5 illustrates an artificial neural network (ANN) architecture 500. During feed-forward operation, a set of input neurons 502 each provide an input voltage in parallel to a respective row of weights 504. A weight 504 is a cross-point device, such as an RPU. The weights 504 each have a settable resistance value, such that a current output flows from the weight 504 to a respective hidden neuron 506 to represent the weighted input. The current output by a given weight is determined as I=v/r, where V is the input voltage from the input neuron 502 and r is the set resistance of the weight 504. The current from each weight adds column-wise and flows to a hidden neuron 506. A set of reference weights 507 have a fixed resistance and combine their outputs into a reference current that is provided to each of the hidden neurons 506. Because conductance values can only be positive numbers, some reference conductance is needed to encode both positive and negative values in the matrix. The currents produced by the weights 504 are continuously valued and positive, and therefore the reference weights 507 are used to provide a reference current, above which currents are considered to have positive values and below which currents are considered to have negative values. By using high ion conductivity electrolyte layer between ion reservoir layers, one or more embodiments of the present invention facilitate very high speed (nanosecond to sub nanosecond) response speed.

The hidden neurons 506 use the currents from the array of weights 504 and the reference weights 507 to perform some calculation. The hidden neurons 506 then output a voltage of their own to another array of weights 507. This array performs in the same way, with a column of weights 504 receiving a voltage from their respective hidden neuron 506 to produce a weighted current output that adds row-wise and is provided to the output neuron 508.

It should be understood that any number of these stages can be implemented, by interposing additional layers of arrays and hidden neurons 506. It should also be noted that some neurons can be constant neurons 509, which provide a constant voltage to the array. The constant neurons 509 can be present among the input neurons 502 and/or hidden neurons 506 and are only used during feed-forward operation.

During back propagation, the output neurons 508 provide a voltage back across the array of weights 504. The output layer compares the generated network response to training data and computes an error. The error is applied to the array as a voltage pulse, where the height and/or duration of the pulse is modulated proportional to the error value. In this example, a row of weights 504 receives a voltage from a respective output neuron 508 in parallel and converts that voltage into a current which adds column-wise to provide an input to hidden neurons 506. The hidden neurons 506 combine the weighted feedback signal with a derivative of its feed-forward calculation and stores an error value before outputting a feedback signal voltage to its respective column of weights 504. This back propagation travels through the entire network 500 until all hidden neurons 506 and the input neurons 502 have stored an error value.

During weight updates, the input neurons 502 and hidden neurons 506 apply a first weight update voltage forward and the output neurons 508 and hidden neurons 506 apply a second weight update voltage backward through the network 500. The combinations of these voltages create a state change within each weight 504, causing the weight 504 to take on a new resistance value. In this manner, the weights 504 can be trained to adapt the neural network 500 to errors in its processing. It should be noted that the three modes of operation, feed forward, back propagation, and weight update, do not overlap with one another.

As previously noted herein, to accommodate the learning speed requirement for deep neural network application, the embodiments of the present invention provide an analog weight update component. For example, a cross-point synaptic device in a cross-bar structure can enable parallel matrix multiplication and improve the neural network training speed.

One or more embodiments of the invention provide a programmable resistive cross-point array, also called a resistive processing unit (RPU). At every intersection of the cross-point columns and rows is a neuromorphic device, referred to herein as a cross-point device, which provides local data storage functionality and local data processing functionality. In other words, when performing data processing, the value stored at each neuromorphic device is updated in parallel and locally, which eliminates the need to move relevant data in and out of a processor and across a bus to separate storage element. Additionally, the local data storage and local data processing provided by the described neuromorphic devices accelerate the ANN's ability to implement algorithms such as matrix inversion, matrix decomposition and the like. Accordingly, implementing a machine learning ANN architecture having the described neuromorphic device enables the implementation that optimize the speed, efficiency and power consumption of the ANN. The described neuromorphic device and resulting ANN architecture improve overall ANN performance and enable a broader range of practical ANN applications.

The neuromorphic device in the cross-bar structure enables parallel matrix multiplication and substantially enhances the neural network training speed. For online training using parallel processing, each weight element has to show symmetric updating characteristic, which means the previous state data has to be retrievable after updating is done, as is known in the art. For example, FETs, whose resistance can be well controlled by gate potential, is one candidate as a weight element for the neural network. Such technical challenges are addressed by the one or more embodiments of the invention described herein by facilitating weight storage elements that use oxygen scavenging electrode.

Figure 6:
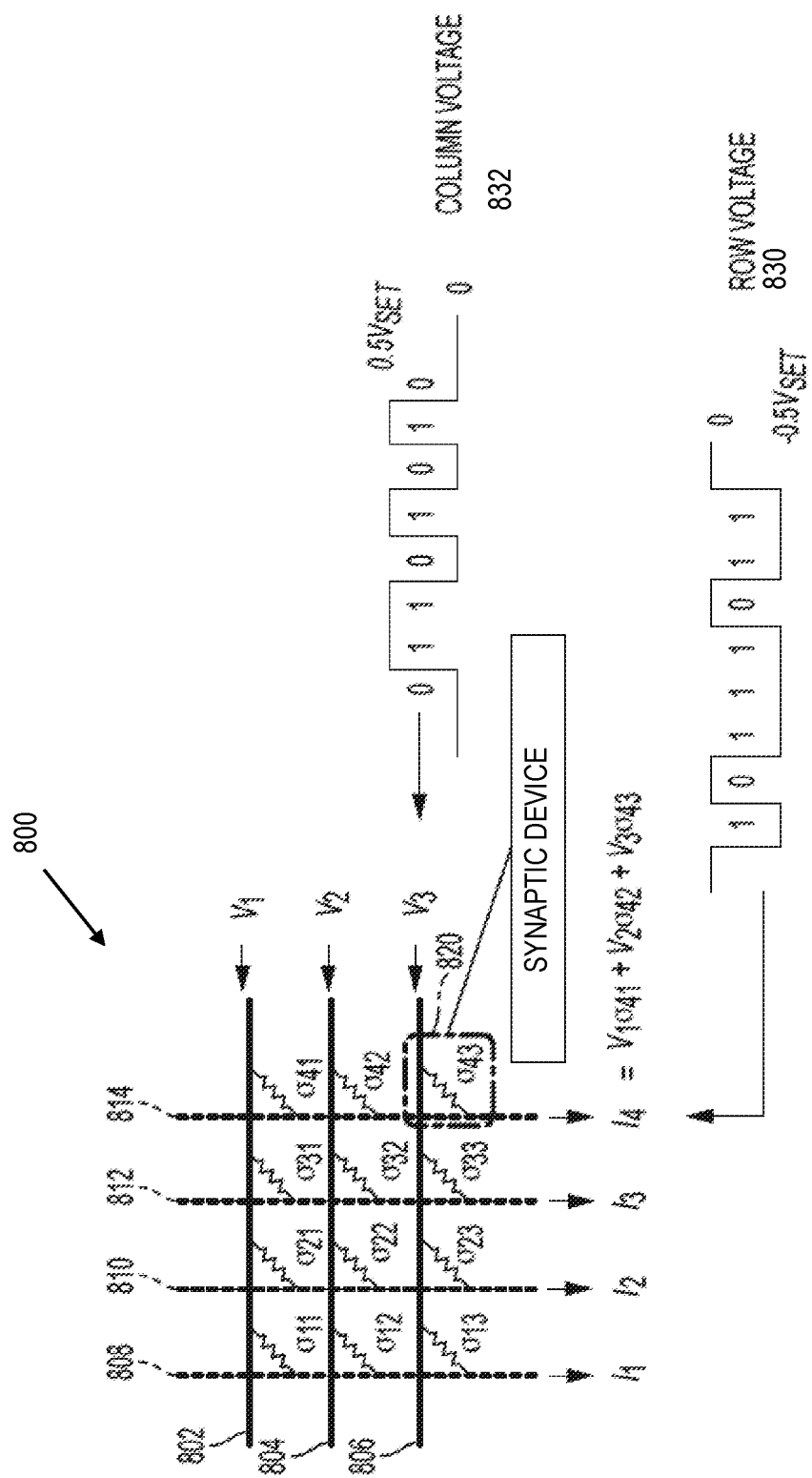
FIG. 6 is a diagram of a two-dimensional (2D) cross-bar array according to one or more embodiments of the present invention.

FIG. 6 depicts a cross-bar array of cross-point synaptic devices according to embodiments of the present invention, along with voltage sequences illustrating the operation of the neuromorphic device. FIG. 6 is a diagram of a two-dimensional (2D) cross-bar array 800 that performs forward matrix multiplication, backward matrix multiplication and weight updates according to embodiments of the present invention. It should be noted that in one or more embodiments of the present invention a chip can include one or more separate cross-bar arrays, each for performing such operations for a separate layers of the ANN being implemented, each cross-bar array 800 corresponding to a respective layer.

The cross-bar array 800 is formed from a set of conductive row wires 802, 804, 806 and a set of conductive column wires 808, 810, 812, and 814 that intersect the set of conductive row wires 802, 804, and 806. The intersections between the set of row wires and the set of column wires are separated by neuromorphic devices, which are shown in FIG. 6 as resistive elements each having its own adjustable/updateable resistive weight, depicted as $\sigma 11$, $\sigma 21$, $\sigma 31$, $\sigma 41$, $\sigma 12$, $\sigma 22$, $\sigma 32$, $\sigma 42$, $\sigma 13$, $\sigma 23$, $\sigma 33$ and $\sigma 43$, respectively. For ease of illustration, only one neuromorphic device 820 is labeled with a reference number in FIG. 6. In forward matrix multiplication, the conductance state (i.e., the stored weights) of the neuromorphic device can be read by applying a voltage across the neuromorphic device and measuring the current that passes through the neuromorphic device.

Input voltages V1, V2, V3 are applied to row wires 802, 804, 806, respectively. Each column wire 808, 810, 812, 814 sums the currents I1, I2, I3, I4 generated by each neuromorphic device along the particular column wire. For example, as shown in FIG. 6, the current I4 generated by column wire 814 is according to the equation $I4=V1/\sigma 41+V2/\sigma 42+V3/\sigma 43$. Thus, the cross-bar array 800 computes the forward matrix multiplication by multiplying the values stored in the neuromorphic devices by the row wire inputs, which are defined by voltages V1, V2, V3. The backward matrix multiplication is very similar. In backward matrix multiplication, voltages are applied at column wires 808, 810, 812, 814 then read from row wires 802, 804, 806. For weight updates, which are described in greater detail below, voltages are applied to column wires and row wires at the same time, and the conductance values stored in the relevant cross-point synaptic devices all update in parallel. Accordingly, the multiplication and addition operations required to perform weight updates are performed locally at each neuromorphic device 820 of array 800 using the cross-point synaptic device itself plus the relevant row or column wire of array 800. Thus, in accordance with the one or more embodiments of the present invention, no read-update-write cycles (shown in FIG. 4) are required in array 800.

Continuing with the diagram of FIG. 6, in accordance with one or more embodiments, the operation of a positive weight update methodology for neuromorphic device 820 and its corresponding weight $\sigma 33$ at the intersection of conductive row wire 806 and conductive column wire 812 will now be provided. Update generator circuitry (not shown) is provided at the periphery of the cross-bar array 800 and used as a peripheral "translator" in order to generate necessary voltage pulses in the form of stochastic bit streams that are applied to all neuromorphic devices of the 2D cross-bar array 800.

Accordingly, referring to the ANN implemented using a cross-point array including RPUs as described herein, in the array, the value of the resistance (or conductance) of each node determines the coupling between nodes, where a node is represented by an cross-point synaptic device in the cross-bar array 800. Further, upon training the cross-bar array 800 according to the ANN, the resistance (or conductance) will be different from each neuromorphic device to neuromorphic device, depending on the desired coupling. For training a neural network, it is necessary to actively adjust the resistance (conductance) values. Once the training is complete, the resistance values remain fixed during operation of the cross-point array circuit, until training begins for a new task.

Figure 7:
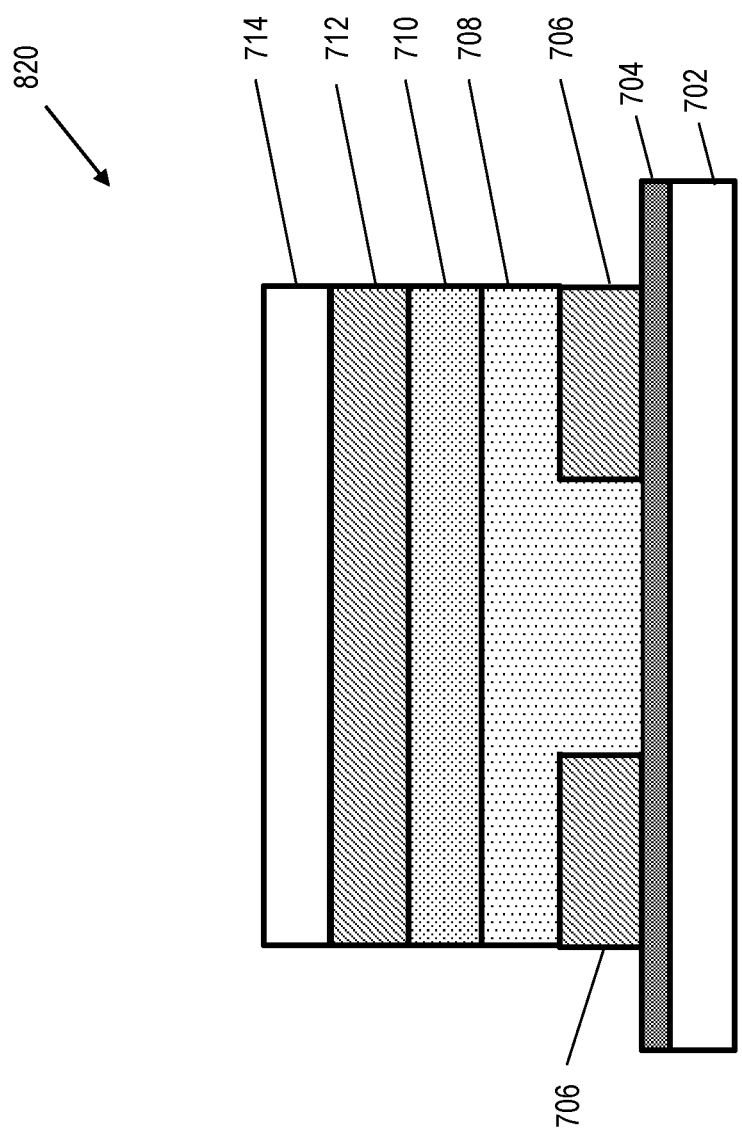
FIG. 7 depicts an example neuromorphic device that includes an oxygen scavenging electrode according to one or more embodiments of the present invention.

FIG. 7 depicts an example neuromorphic device that includes an oxygen scavenging electrode according to one or more embodiments of the present invention. A substrate 702 is shown and is particularly contemplated as being formed from a semiconductor material, though it should be understood that other materials may be used instead. The substrate 702 can be a bulk-semiconductor substrate. In one example, a bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the substrate 702 may also be a semiconductor on insulator (SOI) substrate. Other exemplary substrate materials include glass, sapphire, and diamond.

An insulator layer 704 is formed on the substrate 702, particularly in embodiments whether the substrate 702 is formed from a semiconductor or conductive material. The insulator layer 704 can be formed from silicon nitride, but it should be understood that any appropriate insulator material may be formed by any appropriate process to form the insulator layer 704.

Source and drain structures 706 are formed on the insulator by any appropriate process. For example, the source and drain structures 706 can be formed from, e.g., titanium at a thickness of about 5 nm or platinum at a thickness of about 50 nm, but it should be understood that any appropriate material and thickness may be used, including for example tungsten, nickel, molybdenum, tantalum, copper, silver, gold, ruthenium, iridium, rhenium, rhodium, and alloys thereof. In one or more embodiments of the present invention the source and drain structures 706 may be formed by an appropriate physical vapor deposition (PVD) process, whereby a sputtering apparatus may include electron-beam evaporation, thermal evaporation, direct-current diode systems, radio frequency sputtering, magnetron sputtering, or ionized metal plasma sputtering. The deposited layer may be etched to form the source and drain structures 706 by any appropriate photolithographic process.

A variable-resistance layer 708 is then formed over and between the source and drain structures 706. In one or more embodiments of the present invention the variable-resistance layer 708 is formed from an oxide material, such as tungsten trioxide ($WO_3$) or titanium dioxide ($TiO_2$), which has a resistance that changes based on a concentration of oxygen within the variable-resistance layer 708. The variable-resistance layer 708 may be formed by any appropriate deposition process. For example, a tungsten trioxide layer about 50 nm thick can be formed by sputtering and that a titanium dioxide layer about 40 nm thick can be formed by electron beam evaporation.

The variable-resistance layer 708 accepts additional oxygen ions by intercalation, where the oxide material creates a crystalline structure and additional oxygen ions (e.g., $O^{2-}$) fit into gaps in that crystalline structure under an appropriate voltage. The voltage overcomes the repulsive force created by any electrical charge already present in the variable-resistance layer 708, forcing more charged ions to occupy that layer.

An electrolyte layer 710 is formed on the variable-resistance layer 708. The electrolyte layer 710 is formed from lanthanum trifluoride ($LaF_3$) at a thickness of about 80 nm by a thermal evaporation process. The thickness of the lanthanum trifluoride layer can be in the range of 80-120 nm in one or more embodiments of the present invention. It should be noted that lanthanum trifluoride is stable at room temperature and is conductive to oxygen ions, permitting the transfer of oxygen ions to and from the variable-resistance layer 708. Lanthanum trifluoride can contain substantial amount of oxygen impurities distributed throughout the layer or segregated at its interfaces and studies indicate that at room temperature the majority of the ionic transport is mediated mostly by fluorine mobility across the layer whereas oxygen exchange with the neighboring layers occurs mostly at the interfaces. (Jacob 2006)

In one or more embodiments of the present invention an oxygen reservoir layer 712 may be formed on the electrolyte layer 710. It is specifically contemplated that the oxygen reservoir layer 712 may be formed from any appropriate oxygen-containing material where oxygen ions readily dissociate under an applied voltage. One exemplary material for the oxygen reservoir layer 712 is cerium oxide ($CeO_2$), which reversibly converts to a nonstoichiometric oxide by emitting oxygen ions when subjected to an appropriate voltage. In one specific example, the oxygen reservoir layer 712 may be formed from cerium oxide at a thickness of less than 100 nm by a thermal evaporation process. The thickness of the oxygen reservoir layer 712 can be in a predetermined range. Other oxides capable of oxygen exchange such as but not limited to $WO_3$, $TiO_2$, $CuOx$ or gaseous/atmospheric oxygen may be used for oxygen reservoir.

A gate electrode 714 is formed on the oxygen reservoir layer 712, if such a reservoir layer is present. If not, then the gate electrode 714 is formed on the electrolyte layer 710. The gate electrode 714 applies a voltage across the device that forces oxygen ions into the variable-resistance layer 708. The gate electrode 714 is formed from an oxygen scavenging material, e.g., aluminum. The gate electrode 714 is of a thickness of about 100 nm using thermal evaporation. It should be noted that the gate electrode 714 can be made using any other oxygen scavenging material using any appropriate process other than those described herein.

The neuromorphic device 820 can be patterned and defined through typical semiconductor fabrication techniques including photoresist followed by lift-off using solvents such as acetone or RIE (reactive ion etching).

The integrated current or number of up and down write pulses across the gate stack of the neuromorphic device 820 is broadly proportional to the weight value and can be programmed with either voltage or current pulses.

Accordingly, the neuromorphic device 820 facilitated by one or more embodiments of the present invention described herein provide a gate structure that is compatible with standard CMOS processing. The neuromorphic device 820 can be employed in hardware neural networks that can be formed on a chip alone or integrated with other structures and devices. The gate structure described herein can further include sidewall spacers, a gate cap, dielectric layers, and other structures depending on the device type and design. The neuromorphic device 820 described herein facilitates an improved symmetry in charging and discharging, and an improved ON/OFF ratio compared to existing solutions. Further, the neuromorphic device 820 provides a minimal and non-changing open circuit potential (OCP), thereby improving the symmetry of the neuromorphic system using the neuromorphic devices.

The write/weight update in the cross-point synaptic device 820, in this case, is performed by applying a voltage between the gate terminal 714 and the source, or drain structures 706. For reading the weight value stored in the neuromorphic device 820, the weight value is sensed based on the current flow through the gate stack, between source and drain structures 706. The sensed current provides the weight stored at the neuromorphic device 820.

Referring to FIG. 6, a row voltage sequence or bit stream 830, which is applied to row wire 806, is shown as a sequence of voltage pulses representing weight updates having a voltage of zero or a voltage of +0.5 VSET. A column voltage sequence or bit stream 832, which is applied to column wire 814, is shown as a sequence of voltage pulses also representing weight updates having either a voltage of zero or a voltage of −0.5 VSET. The example voltage sequences 830, 832 represent a positive resistance change phase of the weight update. After the positive weight updates are performed, a separate set of sequences with the polarity of the respective voltages reversed can be used to update weights in a negative direction for those weights that need such correction.

Alternatively, or in addition, in one or more examples, a voltage sequence that is applied to the cross-point synaptic device 820 is the result from the difference between row voltage sequence 830 and column voltage sequence 832.

Figure 8:
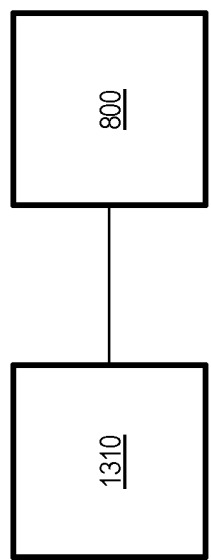
FIG. 8 depicts a system in which the cross-bar array is controlled using a controller for performing the matrix-matrix multiplication among other operations according to one or more embodiments of the present invention.

FIG. 8 depicts a system 1300 in which the cross-bar array 800 is controlled using a controller 1310 for performing the matrix-matrix multiplication among other operations according to one or more embodiments of the present invention. For example, the controller 1310 sends the input matrices to be multiplied by the cross-bar array 800. In one or more examples, the controller 1310 stores the values in the cross-bar array 800 and sends the input vectors 910. In one or more examples, the controller 1310 and the cross-bar array 800 are coupled in a wired or a wireless manner, or a combination thereof. The controller 1310 further sends and instruction/command to the cross-bar array 800 to initiate the matrix-matrix multiplication. The controller 1310 further can read the output vectors 915 from the cross-bar array 800 after receiving a notification that the matrix-matrix multiplication has been performed. The controller 1310 can be a processing unit, or a computing system, such as a server, a desktop computer, a tablet computer, a phone, and the like. The controller 1310 can include a memory device that has computer executable instructions stored therein, the instructions when executed by the controller cause the matrix-matrix computation.

Figure 9:
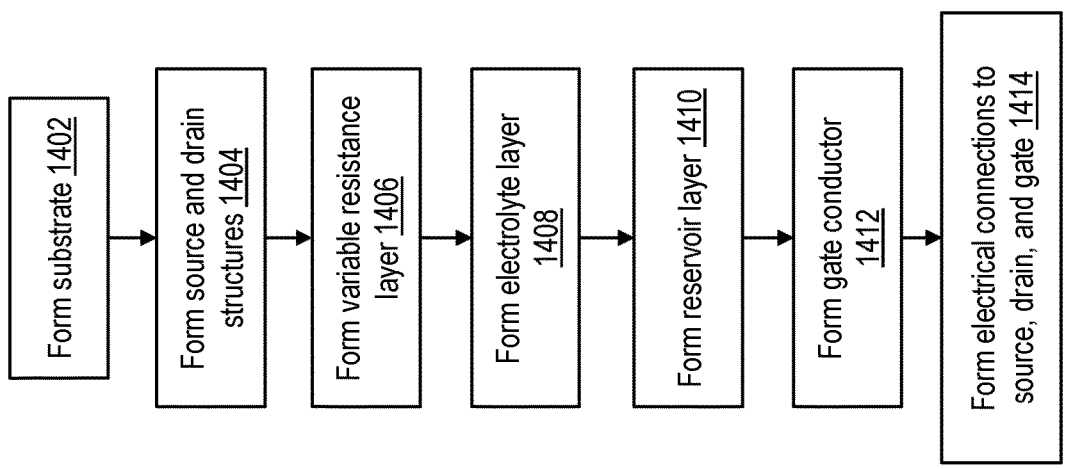
FIG. 9 depicts a flowchart of a process of fabricating a variable-resistance neuromorphic device according to one or more embodiments of the present invention.

FIG. 9 depicts a flowchart of a process of fabricating a variable-resistance neuromorphic device according to one or more embodiments of the present invention. Block 1402 forms the substrate 702. As noted above, the substrate 302 can be formed from any appropriate material and may come in the form of a standard semiconductor wafer. Thus, forming the substrate in block 1402 can include, for example, forming a semiconductor wafer from scratch with the insulator coating 704, or can include purchasing a semiconductor wafer and applying the insulator coating 704. Other options include the formation of non-semiconductor substrates, including insulating or conductive substrates, with or without the insulator layer 704.

Block 1404 forms source and drain structures 706. A conductor layer formed from, e.g., titanium, platinum, or any other appropriate conductor may be deposited using any appropriate deposition process, with electron beam evaporation being specifically contemplated. The conductor layer may then be photolithographically etched to create the source and drain structures 706.

Block 1406 forms the variable-resistance layer 708. This layer can be formed from any appropriate material that intercalates oxygen ions and changes its resistance according to the intercalated oxygen ion concentration. Exemplary materials include tungsten trioxide and titanium dioxide, but it should be understood that other materials may be used as well.

Block 1408 forms the electrolyte layer 710 on the variable-resistance layer 708. The electrolyte later 710 is a material that is solid and stable at room temperature and provides conduction of oxygen ions. In one or more examples, the electrolyte layer 710 is formed from lanthanum trifluoride by a thermal evaporation process.

Block 1410 forms an oxygen reservoir layer 712 on the electrolyte layer 710. The oxygen reservoir layer 712 holds oxygen ions that can be readily dislodged into the electrolyte layer 710. Accordingly, any appropriate oxygen-containing material that will emit oxygen ions under a voltage will be appropriate for this layer, such as cerium oxide. The oxygen reservoir layer 712 is formed using any appropriate deposition process, such as a thermal evaporation process. It should be noted that in one or more embodiments of the present invention the oxygen reservoir layer 712 is not formed and the gate electrode 714 is directly formed on the electrolyte layer 710.

Block 1412 forms a gate electrode 714 over the electrolyte layer 710 and over the oxygen reservoir layer 712, if one is used. The gate electrode 714 is formed from any appropriate conductive material, such as aluminum, and may be formed by any appropriate deposition process. Block 1414 then forms electrical connections to the source and drain structures 706 and to the gate conductor 714. Additional processing steps may be performed, including etching the entire stack to separate neighboring devices from one another, depositing a passivating layer over and around the device(s), and forming vias through the passivating layer to provide electrical access to the source and drain structures 706 and to the gate conductor 714.

The technical solutions described herein improve neuromorphic development process by facilitating weight storage element devices with analog as well as memory properties. The technical solutions described herein speed up the deep neuron network processing and enable online training capability by facilitating neuromorphic devices with back-propagation updating to be used for deep neuron network implementation. The technical solutions accordingly improve computational technology, and particularly cross-bar arrays and ANNs implemented using such cross-bar arrays.

It is to be understood that aspects of the neuromorphic device 820 are described in terms of a given illustrative architecture; however, other architectures, structures, substrate materials and process features and steps can be varied within the scope of aspects of the present invention.

Thus, it can be seen from the foregoing detailed description and accompanying figures that described herein are technical solutions for cross-point synaptic devices, such as Resistive Process Unit (RPU) devices, based on multi-terminal structure. In general, aspects of the invention relate to configurations of trainable cross-point synaptic devices, which are referred to herein as neuromorphic devices. The technical solutions described herein include using cross-point synaptic devices, such as those configured in a cross-point (or cross-bar) array for implementing neural networks, particularly using neuromorphic systems. Embodiments of the present invention implement the weights between neurons in a neural network using neuromorphic devices that have settable resistances. The use of lithium ions to set the resistance of a device presents certain challenges, because lithium compounds are often both water- and air-sensitive and are not readily compatible with existing microfabrication processes.

Embodiments described herein therefore use a material that exhibits resistivity change as a function of a concentration of, e.g., oxygen. While oxygen concentration can effectively tune the resistivity of many different oxide materials, it is difficult to obtain a solid, oxygen-conductive electrolyte, because most such electrolytes take the form of oxides themselves and present variable electric conductivity themselves as oxygen concentrations fluctuate. Some embodiments of the present invention use lanthanum trifluoride ($LaF_3$) as a solid electrolyte later, which provides room-temperature conductance of oxygen ions or ionic exchange at the interfaces mediated by fluorine ion transport.

The present embodiments thereby provide a multi-terminal, for example, three-terminal, neuromorphic device that has a settable resistivity and operates at room temperature. Source and drain terminals provide a resistive path between neurons of a neural network, while a voltage on a gate terminal controls the concentration of oxygen between the source and drain terminals, thereby controlling the resistance between the source and drain terminals.

The technical solutions described herein are rooted in and/or tied to computer technology in order to overcome a problem specifically arising in the realm of computers, specifically neural networks or neuromorphic systems. Neuromorphic systems, also referred to as ANNs, are computational systems that permit electronic systems to essentially function in a manner analogous to that of biological brains. Neuromorphic systems do not generally utilize a traditional digital model of manipulating 0s and 1s. Instead, neuromorphic systems create connections between processing elements that are roughly functionally equivalent to neurons of a biological brain. Neuromorphic systems can include various electronic circuits that model biological neurons.

In biological systems, the point of contact between an axon of a neuron and a dendrite on another neuron is called a synapse, and with respect to the synapse, the two neurons are respectively called pre-synaptic and post-synaptic. The essence of individual human experiences is stored in conductance of the synapses. The synaptic conductance changes with time as a function of the relative spike times of pre-synaptic and post-synaptic neurons, as per spike-timing dependent plasticity (STDP). STDP increases the conductance of a synapse if its post-synaptic neuron fires after its pre-synaptic neuron fires, and decreases the conductance of a synapse if the order of the two firings is reversed. Furthermore, the change depends on the precise delay between the two events, such that the more the delay, the less the magnitude of change.

As such the technical solutions described herein are rooted in and/or tied to computer technology in order to overcome a problem specifically arising in the realm of computers, specifically neural networks. The technical solutions described herein facilitate speeding up deep neuron network processing and enable online training capability. The one or more embodiments of the present invention, accordingly, provide practical applications in ANNs and other technical fields in which the ANNs are used.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The embodiments of the present invention can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A system comprising:
   a controller; and
   a crossbar array coupled with the controller, the crossbar array configured to operate as a neural network, the crossbar array comprising:
   a neuromorphic device at each of a plurality of crosspoints, the neuromorphic device comprising a transistor that comprises:
   a variable-resistance layer, formed between a first terminal and a second terminal, that varies in resistance based on an oxygen concentration in the variable-resistance layer;
   an electrolyte layer over the variable-resistance layer that is stable at room temperature and that conducts oxygen ions in accordance with an applied voltage;
   a gate layer over the electrolyte layer configured to apply a voltage on the electrolyte layer and the variable-resistance layer, the gate layer forming an oxygen scavenging gate electrode; and
   an oxygen reservoir layer between the electrolyte layer and the gate layer that emits oxygen ions under the applied voltage.

2. The system of claim 1, wherein the electrolyte layer comprises lanthanum trifluoride.

3. The system of claim 1, wherein the variable-resistance layer comprises a material that intercalates oxygen under the applied voltage.

4. The system of claim 1, wherein the variable-resistance layer comprises a material selected from the group consisting of tungsten trioxide and titanium dioxide.

5. The system of claim 1, wherein the oxygen reservoir layer comprises cerium oxide.

6. The system of claim 1, wherein the neuromorphic device further comprises a source and a drain terminal, which are formed from a conductive metal.

7. A neuromorphic device comprising:
   a variable-resistance layer, formed between a first terminal and a second terminal, that varies in resistance based on an oxygen concentration in the variable-resistance layer;
   an electrolyte layer over the variable-resistance layer that is stable at room temperature and that conducts oxygen ions in accordance with an applied voltage;
   a gate layer over the electrolyte layer configured to apply a voltage on the electrolyte layer and the variable-resistance layer, the gate layer forming an oxygen scavenging gate electrode; and
   an oxygen reservoir layer between the electrolyte layer and the gate layer, the oxygen reservoir layer emits oxygen ions under the applied voltage.

8. The neuromorphic device of claim 7, wherein the electrolyte layer comprises lanthanum trifluoride.

9. The neuromorphic device of claim 7, wherein the variable-resistance layer comprises a material that intercalates oxygen under the applied voltage.

10. The neuromorphic device of claim 7, wherein the variable-resistance layer comprises a material selected from the group consisting of tungsten trioxide and titanium dioxide.

11. The neuromorphic device of claim 7, wherein the oxygen reservoir layer comprises cerium oxide.

\* \* \* \* \*